United States Patent
Otera et al.

(10) Patent No.: US 9,589,697 B2
(45) Date of Patent: Mar. 7, 2017

(54) ELECTROCONDUCTIVE COMPOSITION, COMPOSITE MATERIAL AND PRODUCTION METHODS THEREOF

(71) Applicants: Shozo Otera, Nagaokakyo (JP); Shiego Mori, Nagaokakyo (JP)

(72) Inventors: Shozo Otera, Nagaokakyo (JP); Shiego Mori, Nagaokakyo (JP)

(73) Assignee: Murata Manufacturing Co., Ltd., Nagaokakyo-shi, Kyoto-fu (JP)

( * ) Notice: Subject to any disclaimer, the term of this patent is extended or adjusted under 35 U.S.C. 154(b) by 205 days.

(21) Appl. No.: 14/521,538

(22) Filed: Oct. 23, 2014

(65) Prior Publication Data

US 2015/0079404 A1 Mar. 19, 2015

Related U.S. Application Data

(63) Continuation of application No. PCT/JP2013/061314, filed on Apr. 16, 2013.

(30) Foreign Application Priority Data

Apr. 23, 2012 (JP) ................. 2012-097634

(51) Int. Cl.
| | |
|---|---|
| *H01B 1/12* | (2006.01) |
| *C08L 25/18* | (2006.01) |
| *C08L 65/00* | (2006.01) |
| *H01L 41/047* | (2006.01) |
| *H01L 41/09* | (2006.01) |
| *H01L 41/193* | (2006.01) |
| *C08L 41/00* | (2006.01) |

(52) U.S. Cl.
CPC .............. *H01B 1/127* (2013.01); *C08L 25/18* (2013.01); *C08L 65/00* (2013.01); *H01B 1/122* (2013.01); *H01L 41/0478* (2013.01); *H01L 41/094* (2013.01); *C08G 2261/1424* (2013.01); *C08G 2261/3223* (2013.01); *C08G 2261/51* (2013.01); *C08G 2261/94* (2013.01); *C08L 41/00* (2013.01); *H01L 41/193* (2013.01); *Y10T 428/3154* (2015.04)

(58) Field of Classification Search
CPC .......... C08L 25/18; C08L 33/24; C08L 33/26; C08L 65/00; H01B 1/122; H01B 1/127; H01L 41/0478; H01L 41/094

USPC ............ 428/421; 252/500; 427/58, 74, 96.1, 427/96.2, 98.4, 100
See application file for complete search history.

(56) References Cited

U.S. PATENT DOCUMENTS

| | | | |
|---|---|---|---|
| 5,035,926 A | 7/1991 | Jonas et al. | |
| 6,642,069 B2 | 11/2003 | Armgarth et al. | |
| 8,236,902 B2 | 8/2012 | Hogen-Esch et al. | |
| 8,637,853 B2 | 1/2014 | Buchholz et al. | |
| 8,921,473 B1 * | 12/2014 | Hyman | C08K 3/04 423/445 R |
| 9,159,940 B2 * | 10/2015 | Kato | C09J 139/06 |
| 2004/0062989 A1 | 4/2004 | Ueno et al. | |
| 2006/0057451 A1 | 3/2006 | Okuzaki et al. | |
| 2010/0039001 A1 | 2/2010 | Kudoh | |
| 2010/0148635 A1 | 6/2010 | Kwon et al. | |
| 2012/0205643 A1 * | 8/2012 | Suematsu | H01L 51/004 257/40 |
| 2014/0211372 A1 | 7/2014 | Sugawara et al. | |

FOREIGN PATENT DOCUMENTS

| | | | |
|---|---|---|---|
| CN | 101828330 A | 9/2010 | |
| JP | 2721700 B2 | 3/1998 | |
| JP | 2002-256129 A | 9/2002 | |
| JP | 2006-028439 A | 2/2006 | |
| JP | 2006-129541 A | 5/2006 | |
| JP | 4004214 B2 | 11/2007 | |
| JP | 4532908 B2 | 11/2007 | |
| JP | 2011-501369 A | 1/2011 | |
| JP | WO 2012043025 A1 * | 4/2012 | ............ C09J 139/06 |
| JP | 05-060422 B2 | 10/2012 | |
| JP | 2012-241068 A | 12/2012 | |
| JP | 2013-089397 A | 5/2013 | |
| WO | WO-2011-115147 A1 | 9/2011 | |

OTHER PUBLICATIONS

PCT/JP2013/061314 ISR dated Jul. 12, 2013.

* cited by examiner

*Primary Examiner* — Douglas Mc Ginty
(74) *Attorney, Agent, or Firm* — Arent Fox LLP

(57) ABSTRACT

An electroconductive composition including polystyrene sulfonic acid, poly(3,4-ethylenedioxythiophene), water, an organic solvent having an affinity to water and a polymer having an amide group as a side chain.

16 Claims, 1 Drawing Sheet

ELECTROCONDUCTIVE COMPOSITION, COMPOSITE MATERIAL AND PRODUCTION METHODS THEREOF

CROSS REFERENCE TO RELATED APPLICATIONS

The present application is a continuation of International application No. PCT/JP2013/061314, filed Apr. 16, 2013, which claims priority to Japanese Patent Application No. 2012-097634, filed Apr. 23, 2012, the entire contents of each of which are incorporated herein by reference.

FIELD OF THE INVENTION

The present invention relates to an electroconductive composition, and more specifically, it relates to an electroconductive composition including polystyrene sulfonic acid and poly(3,4-ethylenedioxythiophene) (hereinafter, also referred to as "PEDOT-PSS" in the present description). Moreover, the present invention also relates to a composite material obtained by using the electroconductive composition and production methods thereof.

BACKGROUND OF THE INVENTION

An electroconductive polymer is a polymer which exhibits electroconductivity by being allowed to have a π-conjugated structure extending along the polymer main chain. As the electroconductive polymer, poly(3,4-ethylenedioxythiophene) (PEDOT) has been known (see, for example, Patent Literature 1). In particular, PEDOT-PSS which contains polystyrene sulfonic acid (PSS) is easily applied to a base material since the PEDOT-PSS is obtained in the state of being dispersed in water, and moreover, its application has expanded since the PEDOT-PSS has excellent characteristics such as being excellent in transparency, being high in stability and being capable of providing low to high electroconductivity (see, for example, Patent Literatures 2 to 4).

Patent Literature 1: JP 2721700 B1
Patent Literature 2: JP 4532908 B1
Patent Literature 3: JP 2006-28439 A
Patent Literature 4: JP 4004214 B1
Patent Literature 5: JP 2011-501369 W
Patent Literature 6: JP 05-60422 B

SUMMARY OF THE INVENTION

However, in the case where the PEDOT-PSS water dispersion is applied to a base material and the water is removed by heated-air drying and the like to form a PEDOT-PSS film on the base material, there is a difficult point that the adhesive strength of the film to the base material is low. In general, it is extremely difficult to directly form a PEDOT-PSS film having a sufficient level of adhesive strength for practical use on a base material made of glass or plastic using the PEDOT-PSS water dispersion without using a binder resin.

In order to cope with the difficult point, there has been proposed a method of introducing fluorine-containing groups into both of the material for a base material and PEDOT and enhancing the adhesive strength by the fluorine-fluorine interaction therebetween (see Patent Literature 5). However, the method is not necessarily satisfactory since it is necessary to introduce fluorine-containing groups into the material for a base material in advance and the characteristics of the base material can be varied by introducing fluorine-containing groups thereinto.

Moreover, even when the material for a base material originally having fluorine-containing groups is used, for example, polyvinylidene fluoride (PVDF) has been known as a material which hardly sticks to other objects (see Patent Literature 6). Even when a PEDOT-PSS water dispersion added with a binder resin is used, in the case of using such a binder resin which has hitherto been known, it is extremely difficult to directly form a PEDOT-PSS film on a base material composed of PVDF.

The present invention is aimed at providing an electroconductive composition which is an electroconductive composition containing PEDOT-PSS and enables a PEDOT-PSS film having an enhanced adhesive strength to a base material to be formed. In addition, the present invention is aimed at providing a composite material obtained by using the electroconductive composition and production methods of an electroconductive composition and a composite material.

The present inventors have conducted studies on a binder resin to be added to a PEDOT-PSS water dispersion in order to enhance the adhesive strength to a base material, and as a result of further intensive studies, the present invention has been completed.

According to an aspect of the present invention, there is provided an electroconductive composition including polystyrene sulfonic acid, poly(3,4-ethylenedioxythiophene), water, an organic solvent having an affinity to water and a polymer having an amide group as a side chain.

In the present invention, polystyrene sulfonic acid and poly(3,4-ethylenedioxythiophene) constitute PEDOT-PSS. According to the electroconductive composition of the present invention, since PEDOT-PSS is dispersible in water, and on the other hand, a polymer having an amide group as a side chain is soluble or dispersible in an organic solvent, and then, the organic solvent has an affinity with water, and moreover, the polymer having an amide group as a side chain is high in affinity with PEDOT-PSS and water, an electroconductive composition in which each of these components substantially uniformly exists can be obtained. In the case where a film is formed by using the electroconductive composition, by the presence of the polymer having an amide group as a side chain, the adhesive strength to a base material can be enhanced compared to a conventional PEDOT-PSS water dispersion.

In an embodiment of the present invention, it is preferred that the nitrogen atom of the amide group be a tertiary nitrogen atom. According to the embodiment, since the amide group has no hydrogen atom directly bonded to the nitrogen atom, it is possible to effectively prevent the amide group from being hydrolyzed and to enhance the stability of the electroconductive composition.

In an embodiment of the present invention, it is preferred that the organic solvent includes one or two or more kinds selected from among a glycol and derivatives thereof. According to the embodiment, it is possible to enhance the electroconductivity of a film.

According to another aspect of the present invention, there is provided a composite material including a vinylidene fluoride-based resin base material, and an electroconductive film which is an electroconductive film covering at least a part of the surface of the vinylidene fluoride-based resin base material and includes polystyrene sulfonic acid, poly(3,4-ethylenedioxythiophene) and a polymer having an amide group as a side chain.

According to the composite material of the present invention, even when a vinylidene fluoride-based resin base material such as PVDF is used, by the presence of the polymer having an amide group as a side chain, it is possible to attain high adhesive strength between the base material and an electroconductive film and to obtain an electroconductive film having a uniform film quality.

According to another aspect of the present invention, there is also provided an actuator prepared with the composite material. In the actuator, the composite material can be utilized as an element for an actuator (an element for allowing displacement to be generated in the actuator such as an electrostrictive element or the like).

According to another aspect of the present invention, there is provided a production method of an electroconductive composition including the steps of: obtaining a polymer having an amide group as a side chain by allowing at least a monomer containing an amide group and at least one kind selected from the group consisting of a (meth)acryl-based monomer and/or another vinyl-based monomer to undergo copolymerization; and obtaining an electroconductive composition by mixing the polymer having an amide group as a side chain with polystyrene sulfonic acid, poly(3,4-ethylenedioxythiophene), water and an organic solvent having an affinity to water.

In this connection, the term "(meth)acryl" refers to a concept that includes both of "acryl" and "methacryl" and either of them is acceptable.

By the production method of the electroconductive composition, it is possible to produce the electroconductive composition according to the present invention. However, the electroconductive composition may be produced by another method such as a method including the step of allowing any appropriate monomer having an amide group to undergo polymerization alone or allowing the monomer and other one or two or more kinds of monomers copolymerizable therewith to undergo polymerization.

According to another aspect of the present invention, there is provided a production method of a composite material including a vinylidene fluoride-based resin base material and an electroconductive film including the steps of: supplying at least a part of the surface of a vinylidene fluoride-based resin base material with an electroconductive composition including polystyrene sulfonic acid, poly(3,4-ethylenedioxythiophene), water, an organic solvent having an affinity to water and a polymer having an amide group as a side chain; and removing the water and the organic solvent from the electroconductive composition supplied to at least a part of the surface of the vinylidene fluoride-based resin base material to form an electroconductive film.

By the production method of the composite material, it is possible to produce the composite material according to the present invention, and even when a vinylidene fluoride-based resin base material such as PVDF is used, by the presence of the polymer having an amide group as a side chain, it is possible to directly form an electroconductive film on a base material and to enhance the adhesive strength to the base material.

According to another aspect of the present invention, there is also provided a production method of an actuator including the step of using the composite material as an element for an actuator.

According to the present invention, in an electroconductive composition including PEDOT-PSS, by using, as a binder resin, a polymer having an amide group as a side chain, and allowing water and an organic solvent having an affinity to water, in addition to the polymer, to be contained, there is provided an electroconductive composition which enables a PEDOT-PSS film having an enhanced adhesive strength to a base material to be formed. In addition, according to the present invention, there are also provided a composite material obtained by using the electroconductive composition, and production methods of an electroconductive composition and a composite material.

BRIEF EXPLANATION OF THE DRAWINGS

FIG. 1(a) shows the actuator in a state of allowing no voltage to be applied between the electrodes (non-driven state) and FIG. 1(b) shows the actuator in a state of allowing a voltage to be applied between the electrodes (driven state).

Figure 1A:
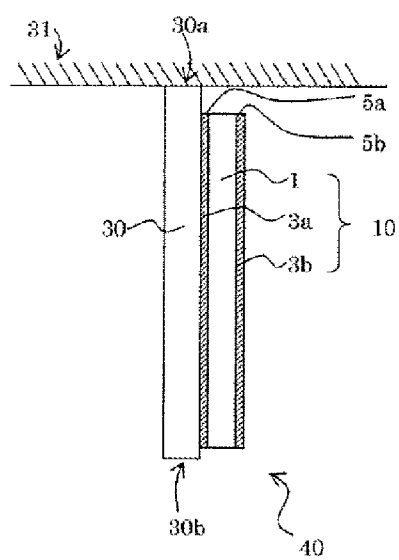
FIGS. 1(a) and 1(b) are schematic cross-sectional views showing an actuator prepared in Example of the present invention, where

DETAILED DESCRIPTION OF THE INVENTION (Electroconductive Composition and Production Method Thereof)

The electroconductive composition according to the present invention includes polystyrene sulfonic acid, poly(3,4-ethylenedioxythiophene), water, an organic solvent having an affinity to water and a polymer having an amide group as a side chain.

In the electroconductive composition according to the present invention, polystyrene sulfonic acid and poly(3,4-ethylenedioxythiophene) constitute PEDOT-PSS. The PEDOT-PSS refers to PEDOT containing PSS and is dispersible (preferably finely dispersible) in water.

For example, the proportion (abundance ratio) of PEDOT to PSS in the electroconductive composition is preferably 1:1.5 to 3.5 in terms of the weight ratio of PEDOT to PSS, and by selecting the range, it is possible to heighten the electroconductivity of a film obtained in the case where the film is formed by using the electroconductive composition.

With regard to the organic solvent, any organic solvent may be used as long as the solvent has an affinity to water. In the present invention, a solvent "having an affinity to water" means the solvent having a solubility to water of at least 5 mg/100 mL water (ordinary temperature, for example 20 to 25° C.). An organic solvent having high affinity to water, namely hydrophilicity, is preferred although the present invention is not limited thereby, and specifically, an organic solvent having a solubility to water of at least 20 mg/100 mL water is preferred and an organic solvent arbitrarily miscible to water is more preferred.

Examples of the organic solvent having an affinity to water include an alcohol-based solvent such as methanol, ethanol, allyl alcohol, n-propyl alcohol, isopropyl alcohol, n-butyl alcohol, isobutyl alcohol, sec-butyl alcohol and glycol, a ketone-based solvent such as acetone and methyl ethyl ketone, an amide-based solvent such as dimethylformamide and dimethylacetamide, an ether-based solvent such as dioxane, a nitrile-based solvent such as acetonitrile and derivatives thereof. The organic solvent may be composed of one kind of these and may be a mixture of two or more kinds thereof.

In particular, it is preferred that the organic solvent includes one or two or more kinds selected from a glycol and derivatives thereof. In the case where a film is formed by using an electroconductive composition prepared with a glycol and derivatives thereof, it is possible to enhance the electroconductivity of the film. Although the present invention is not restrained by any theory, it is thought that this is because PEDOT exhibiting electroconductivity becomes easy to be arranged on a base material. Examples of the glycol include ethylene glycol, propylene glycol, butylene glycol, diethylene glycol, dipropylene glycol, triethylene glycol and the like. The derivatives of the glycol are exemplified by glycol ethers, and examples thereof include ethylene glycol monomethyl ether, ethylene glycol monoethyl ether, ethylene glycol dimethyl ether, ethylene glycol diethyl ether, ethylene glycol monobutyl ether, diethylene glycol monomethyl ether, diethylene glycol monoethyl ether, diethylene glycol diethyl ether, diethylene glycol monobutyl ether and the like.

As schematically shown below, the polymer having an amide group as a side chain needs only to have an amide group (—C(=O)—N<) as a side chain branched from the polymer main chain.

[Chemical 1]

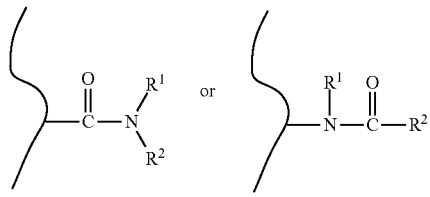

In the formula, $R^1$ and $R^2$ each independently represent one of a hydrogen atom and a monovalent organic group (for example 1 to 8 carbon atoms), and in the case where $R^1$ and $R^2$ are bonded to each other to constitute a ring structure, the whole —$R^1$—$R^2$— represents a divalent organic group (for example 4 to 8 carbon atoms). The organic group may be a straight-chain, branched-chain or cyclic hydrocarbon group, may contain a hetero atom, and may be substituted.

In this connection, the polymer needs only to have any one of these two kinds of amide groups schematically shown above, and may have both groups.

More specifically, examples of the amide group constituting the side chain include structures of the following (a) to (i).

[Chemical 2]

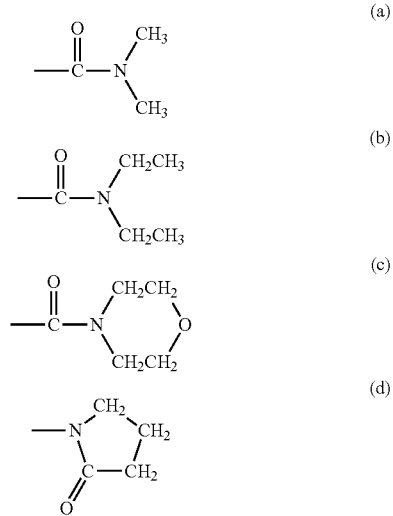

-continued

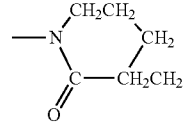

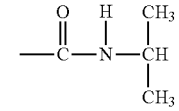

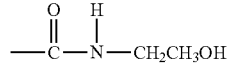

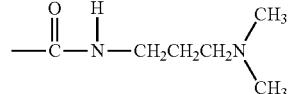

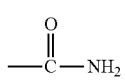

It is preferred that the nitrogen atom of an amide group constituting the side chain be a secondary or tertiary nitrogen atom, and it is more preferred that the nitrogen atom be a tertiary nitrogen atom (in the case where $R^1$ and $R^2$ are bonded to the nitrogen atom of an amide group, both of $R^1$ and $R^2$ are not hydrogen atoms, and in the case where $R^1$ is bonded to the nitrogen atom of an amide group and $R^2$ is not bonded thereto, $R^1$ is not a hydrogen atom), in other words, be an N,N-substituted amide group and the nitrogen atom of the amide group be protected by a substituent. More specifically, examples of the amide group constituting the side chain include structures of the foregoing (a) to (i), secondary or tertiary structures of the foregoing (a) to (h) are preferred, and of these, tertiary structures of the foregoing (a) to (e) are more preferred. The amide group can undergo hydrolysis under an acidic atmosphere, the larger the number of hydrogen atoms bonded to the nitrogen atom of the amide group is, the more the amide group becomes easy to be hydrolyzed, and for example, when an amide group is hydrolyzed as shown in the following equation, the function derived from the amide group is lowered. In contrast, when the nitrogen atom of an amide group is a secondary or higher nitrogen atom, particularly a tertiary nitrogen atom, the hydrolysis reaction hardly occurs and the amide group can more stably exist.

[Chemical 3]

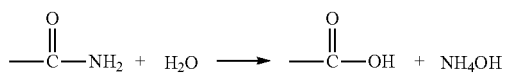

The polymer having an amide group as a side chain may be a single polymer (homopolymer) of any appropriate monomer containing an amide group, and may be an interpolymer (copolymer, terpolymer, and the like) of the monomer and other one or two or more kinds of monomers copolymerizable therewith.

For example, as schematically shown below, the monomer unit containing an amide group may be a (meth) acrylamide-based monomer unit, and moreover, although another monomer unit copolymerizable with a monomer containing an amide group may be a vinyl-based monomer unit such as another (meth)acryl-based monomer unit, the monomer unit is not limited thereto.

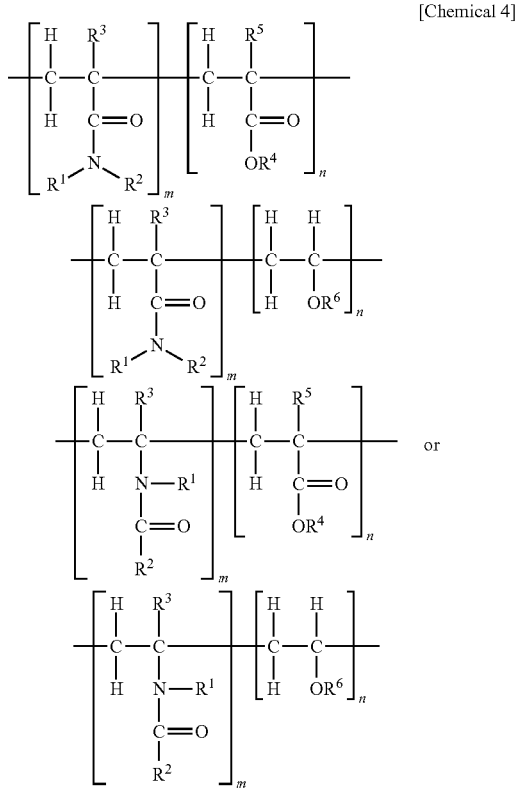

[Chemical 4]

In the formula, $R^1$ and $R^2$ represent the same meaning as above, preferably represent a hydrocarbon group with 1 to 5 carbon atoms, may contain a hetero atom such as an oxygen atom, a nitrogen atom, a phosphorus atom and a halogen atom, and moreover, may be bonded to each other. $R^3$ and $R^5$ each independently represent one of a hydrogen atom and a methyl group, and $R^4$ and $R^6$ represent one of a hydrogen atom and a monovalent organic group. Moreover, in the formula, m represents an integer of 1 or more, n represents one of 0 and an integer of 1 or more, and for example, $m/(m+n) \times 100(\%)$ is 5% or more and 100% or less.

In this connection, although examples of two kinds of monomer units combined are shown above, the combination is not limited thereto and three or more kinds thereof may be combined.

In the electroconductive composition according to the present invention, although PEDOT-PSS can be contained, for example, in an amount of 0.1 to 2% by weight (total of PEDOT and PSS), water can be contained, for example, in an amount of 10 to 70% by weight, an organic solvent having an affinity to water can be contained, for example, in an amount of 10 to 70% by weight, and a polymer having an amide group as a side chain can be contained, for example, in an amount of 0.001 to 20% by weight, preferably 0.5 to 20% by weight (provided that the total amount thereof does not exceed 100% by weight), the composition is not limited thereto.

In addition, any appropriate additive such as an ultraviolet ray absorber, an oxidation inhibitor (for example, dibutyl-hydroxytoluene), a dye, a pigment, a flame retarding agent, a crosslinking agent, a polymerization initiator, a polymerization retarder, a plasticizer, an adhesive and other additives may be contained in the electroconductive composition according to the present invention within the range of not impairing the effect of the present invention.

Next, an example of the production method of an electroconductive composition according to the present invention will be described.

First, PEDOT-PSS is prepared. PEDOT-PSS can be prepared by any appropriate method. For example, PEDOT-PSS can be obtained by allowing polystyrene sulfonic acid (PSS) to be dissolved or dispersed in water and/or an organic solvent in advance and allowing 3,4-ethylenedioxythiophene (EDOT) to undergo polymerization in the solvent. The polymerization of EDOT can be performed by a known method, for example, one of a chemical oxidation polymerization method and an electrolytic polymerization method. When water is used as the solvent, a dispersion prepared by dispersing PEDOT-PSS in water can be obtained. The PEDOT-PSS water dispersion is commercially available.

Moreover, a polymer having an amide group as a side chain is prepared. The polymer can also be prepared by any appropriate method. In order to obtain a polymer having an amide group as a side chain, a monomer incorporated with (for example substituted with) an amide group as a side chain not taking part in the polymerization reaction needs only to be used, and the polymer can be relatively easily obtained according to known conditions for polymerization reaction. For example, a polymer having an amide group as a side chain may be obtained by allowing at least a (meth) acrylamide-based monomer and a vinyl-based monomer such as any other (meth)acryl-based monomer (one or more kinds thereof may be employed) to undergo copolymerization.

Examples of the (meth)acrylamide-based monomer include N,N-dimethylacrylamide, N,N-diethylacrylamide, acryloyl morpholine, N-vinylpyrrolidone, vinylcaprolactone, N-isopropylacrylamide, N-(2-hydroxyethyl)acrylamide, dimethylaminopropylacrylamide and an acrylamide, preferred are N,N-dimethylacrylamide, N,N-diethylacrylamide, acryloyl morpholine, N-vinylpyrrolidone, vinylcaprolactone, N-isopropylacrylamide, N-(2-hydroxyethyl) acrylamide and dimethylaminopropylacrylamide, and more preferred are N,N-dimethylacrylamide, N,N-diethylacrylamide, acryloyl morpholine, N-vinylpyrrolidone and vinylcaprolactone.

It is preferred that another (meth)acryl-based monomer be one of (meth)acrylic acid and a derivative thereof. Examples of the derivative of (meth)acrylic acid include an alkyl ester (methyl (meth)acrylate, ethyl (meth)acrylate, n-butyl (meth) acrylate, i-butyl (meth)acrylate, t-butyl (meth)acrylate, 2-ethylhexyl (meth)acrylate, dodecyl (meth)acrylate (lauryl (meth)acrylate), tridecyl (meth)acrylate, octadecyl (meth) acrylate (stearyl (meth)acrylate) and the like); one of a ring structure-containing ester and an unsaturated double bond-containing ester (cyclohexyl (meth)acrylate, benzyl (meth) acrylate, isobornyl (meth)acrylate, glycidyl (meth)acrylate, tetrahydrofurfuryl (meth)acrylate, allyl (meth)acrylate and the like); one of a hydroxy group-containing ester and an alkoxy group-containing ester (2-hydroxyethyl (meth) acrylate, hydroxypropyl (meth) acrylate, 2-methoxyethyl (meth) acrylate, 2-ethoxyethyl (meth)acrylate and the like); dimethacrylate and trimethacrylate (ethylene glycol di(meth) acrylate, triethylene glycol di(meth)acrylate, 1,3-butylene glycol di(meth)acrylate, 1,6-hexanediol di(meth)acrylate, polypropylene glycol di(meth)acrylate, trimethylolpropane tri(meth)acrylate and the like); a carboxylic acid-containing ester (2-(meth)acryloyloxyethyl phthalic acid, 2-(meth)acryloyloxyethyl hexahydrophthalic acid and the like); a dialkylaminoethyl ester (dimethylaminoethyl (meth) acrylate, dimethylaminoethyl (meth) acrylate-methyl chloride salt, dimethylaminoethyl (meth) acrylate-benzyl chloride salt, diethylaminoethyl (meth)acrylate and the like); and a fluoroalkyl ester (trifluoroethyl (meth) acrylate, heptadecafluorodecyl (meth)acrylate and the like).

Moreover, any other examples of the vinyl-based monomer include vinyl acetate, vinyl sulfonic acid, a maleic acid ester, methyl vinyl ether, butyl vinyl ether and the like.

The copolymerization of a (meth)acrylamide-based monomer and a vinyl-based monomer such as any other (meth)acryl-based monomer can be performed by a conventionally known method such as bulk polymerization, suspension polymerization, emulsion polymerization and solution polymerization. Usually, a polymerization initiator can be used for the polymerization. In particular, when a polymer having an amide group as a side chain is obtained by solution polymerization with an organic solvent (which is inactive under the polymerization condition) having an affinity to water, it is convenient because the organic solvent can be utilized in the next mixing step. As the organic solvent having an affinity to water, those exemplified above are commercially available.

Then, the polymer having an amide group as a side chain obtained in this way is mixed in a desired proportion with PEDOT-PSS, water and an organic solvent having an affinity to water. The PEDOT-PSS used for the mixing may be in the form of a water dispersion, and the polymer having an amide group as a side chain may be in the form of being dissolved or dispersed in an organic solvent having an affinity to water. Moreover, such additives as described above may be appropriately added.

The electroconductive composition according to the present invention can be produced as the mixture thus obtained. In the electroconductive composition, water and an organic solvent having an affinity to water constitute a mixed solvent. The PEDOT-PSS is dispersible in water, and on the other hand, the polymer having an amide group as a side chain is soluble or dispersible in an organic solvent. In addition, the polymer having an amide group as a side chain has high affinity with PEDOT-PSS. Accordingly, in the electroconductive composition according to the present invention, each of these components substantially uniformly exists, and more specifically, the PEDOT-PSS and the polymer having an amide group as a side chain are dispersed or dissolved in a mixed solvent constituted of water and an organic solvent having an affinity with water.

The electroconductive composition according to the present invention has an advantage such that the application (for example, coating by gravure printing, screen printing, flexographic printing or the like, spraying, spin coating, immersion and the like) to a base material is easily performed. And then, in the case where a film is formed by using the electroconductive composition according to the present invention, by the presence of the polymer having an amide group as a side chain, the adhesive strength to a base material can be enhanced compared to a conventional PEDOT-PSS water dispersion.

Although the present invention is not restrained by any theory, the reason why the adhesive strength to a base material is enhanced is assumed to be as follows. Since PEDOT generally easily becomes an oligomer, PEDOT-PSS is constituted by allowing a relatively short segment of PEDOT to bind to a long polymer chain of PSS. Accordingly, in the case where a conventional PEDOT-PSS water dispersion is applied to a base material, the adhesive strength to a base material is low since the PEDOT has a fine particle shape, and moreover, the PSS has high polarity and thereby makes the affinity to a base material (particularly, an organic hydrophobic face) poor. In contrast, in the electroconductive composition according to the present invention, in addition to PEDOT-PSS, since the polymer having an amide group, which is high in affinity therewith, as a side chain exists as a binder resin, in the case where the electroconductive composition according to the present invention is applied to a base material, these polymer chains are left behind on the base material in the state of being entangled with each other (and allowed to become a polymer alloy) to form a film. And then, the polymer chain easily appears on the film surface since the amide group exists as the side chain, and the adhesive strength between the film and the base material can be enhanced since the affinity to the base material is high.

The electroconductive composition according to the present invention exhibits electroconductivity by virtue of PEDOT-PSS, and the same holds true for a film prepared therewith. Although the electroconductive composition according to the present invention also contains a polymer having an amide group as a side chain, even when the polymer is contained therein, the lowering in electroconductivity can be suppressed to a minimum since the polymer having an amide group as a side chain can exert an adhesion effect even if small in amount.

The electroconductive composition according to the present invention can be utilized as an electroconductive organic material in various applications. For example, the electroconductive composition can be used as a film material for electrode formation, for preventing the electrification, for shielding electromagnetic waves or the like, and moreover, as an electroconductive adhesive, an electroconductive paint (or ink) or the like. However, the application of the electroconductive composition according to the present invention is not limited thereto.

(Composite Material and Production Method Thereof)

The composite material according to the present invention includes a vinylidene fluoride-based resin base material, and an electroconductive film which is an electroconductive film covering at least a part of the surface of the vinylidene fluoride-based resin base material and includes polystyrene sulfonic acid, poly(3,4-ethylenedioxythiophene) and a polymer having an amide group as a side chain.

The vinylidene fluoride-based resin base material needs only to be one in which at least the surface to be covered with an electroconductive film is composed of a vinylidene fluoride-based resin. The area in the surface of the vinylidene fluoride-based resin base material to be covered with an electroconductive film varies depending upon the application of the composite material.

The vinylidene fluoride-based resin may be a single polymer (homopolymer) of vinylidene fluoride, and may be an interpolymer (copolymer, terpolymer, and the like) of the vinylidene fluoride and other one or two or more kinds of monomers copolymerizable therewith. Examples of the interpolymer include a copolymer such as P(VDF-TrFE), and a terpolymer such as P(VDF-TrFE-CFE), P(VDF-TrFE-CTFE), P(VDF-TrFE-CDFE), P(VDF-TrFE-HFA), P(VDF-TrFE-HFP) and P(VDF-TrFE-VC) (P, VDF, TrFE, CFE, CTFE, CDFE, HFA, HFP and VC mean poly, vinylidene fluoride, trifluoroethylene, chlorofluoroethylene, chlorotrifluoroethylene, chlorodifluoroethylene, hexafluoroacetone, hexafluoropropylene and vinyl chloride, respectively).

For the polystyrene sulfonic acid, the poly(3,4-ethylenedioxythiophene) (these constitute PEDOT-PSS) and the polymer having an amide group as a side chain which are included in the electroconductive film, the above description for the electroconductive composition holds true.

Next, an example of the production method of a composite material according to the present invention will be described.

First, a vinylidene fluoride-based resin base material is prepared. The vinylidene fluoride-based resin base material can be prepared by any appropriate method and is commercially available.

Moreover, an electroconductive composition including PEDOT-PSS, water, an organic solvent having an affinity to water and a polymer having an amide group as a side chain is prepared. As the electroconductive composition, the above-described electroconductive composition according to the present invention is used.

Then, the electroconductive composition is supplied (or applied) to at least a part of the surface of a vinylidene fluoride-based resin base material. The supplying method is not particularly limited, and for example, any appropriate method such as coating (by gravure printing, screen printing, flexographic printing or the like), spraying, spin coating and immersion can be utilized. Moreover, the surface not to be supplied (coated) therewith may be appropriately shielded in advance with a mask or the like.

Next, the water and the organic solvent are removed from the electroconductive composition supplied to at least a part of the surface of the vinylidene fluoride-based resin base material. Although the removing method is not particularly limited, the water and organic solvent can be removed preferably by heating and/or drying. The heating temperature can be determined in view of the boiling point of water, the boiling point of the organic solvent, the boiling point of the azeotropic composition in the case where water and the organic solvent azeotropically boil, the mixing ratio of water and the organic solvent, and the like. Conveniently, the removal can be performed by heating at, for example, 60 to 150° C. under an air or inert atmosphere. Although almost all of the water can be substantially removed by the removal operation, a minimal amount of the organic solvent cannot be removed and can be inevitably left behind with the PEDOT-PSS and the polymer having an amide group as a side chain.

An electroconductive film is formed as the residue thus obtained from the electroconductive composition, and this enables the composite material according to the present invention to be produced. In the composite material, high adhesive strength is exhibited since the electroconductive film is brought into close contact with the vinylidene fluoride-based resin base material to be formed.

Although the present invention is not restrained by any theory, the reason why the adhesive strength to a vinylidene fluoride-based resin base material is enhanced is assumed to be as follows. In general, PVDF exhibits high chemical resistance, but PVDF has been known to dissolve in N,N-dimethylformamide and dimethyl sulfoxide. In particular, the present inventors have focused their attention on the action of the amide group on the vinylidene fluoride monomer unit. According to the composite material of the present invention, since a polymer having an amide group, which is high in affinity with a vinylidene fluoride monomer unit, as a side chain exists in the electroconductive film, the electroconductive film is brought into close contact with the vinylidene fluoride-based resin base material which is brought into contact therewith and high adhesive strength can be exhibited. And then, since the polymer having an amide group as a side chain is high in affinity also to PEDOT-PSS existing in the electroconductive film similarly, it is possible to directly form an electroconductive film including PEDOT-PSS on a vinylidene fluoride-based resin base material.

The electroconductive film in the composite material according to the present invention exhibits electroconductivity by virtue of PEDOT-PSS. In order to enhance the adhesive strength to a vinylidene fluoride-based resin base material, it can be thought that, to the electroconductive composition including PEDOT-PSS, PVDF is added in place of the polymer having an amide group as a side chain to directly form an electroconductive film including PEDOT-PSS on a vinylidene fluoride-based resin base material. However, PVDF is low in affinity with PEDOT-PSS, and moreover, the resulting film has a difficult point that the electroconductivity is remarkably lowered by the addition of PVDF. In contrast, in the composite base material according to the present invention, the difficult point can be substantially eliminated since the polymer having an amide group as a side chain is used.

The composite material according to the present invention can be utilized in various applications. For example, the vinylidene fluoride-based resin base material is used for a piezoelectric or electrostrictive body in a piezoelectric or electrostrictive element, a binder for negative electrode in a lithium ion battery and the like, and an electroconductive film formed on the surface of the vinylidene fluoride-based resin base material can be utilized as an electrode, a current collector and the like in the application. According to the present invention, since an electroconductive film is formed directly on a vinylidene fluoride-based resin base material and high adhesive strength is exhibited, an electrode or a current collector having high reliability can be obtained. However, the application of the composite material according to the present invention is not limited thereto.

Hereinabove, the electroconductive composition and the production method thereof and the composite material and the production method thereof according to the present invention are described in detail, but the present invention is not limited to the embodiments.

Moreover, it will be possible for the scope of the basic concept of the present invention to be extended not only to PEDOT-PSS but also to other electroconductive polymers similar thereto. Specifically, in place of PEDOT, it will be also possible for other polymers having a n-conjugated structure extending along the polymer main chain such as polyaniline and polypyrrole (any of them may have a substituent and may be a copolymer including these monomer units) to be used. Moreover, in place of PSS, it will be also possible for other organic sulfonic acid-based dopants such as polyvinylsulfonic acid, polyallylsulfonic acid, poly-2-acrylamide-2-methylpropanesulfonic acid and polyisoprenesulfonic acid to be used.

EXAMPLES

According to the following procedure, the electroconductive composition according to the present invention was prepared and an electroconductive film obtained from the electroconductive composition was evaluated for the adhesive strength to a base material and the electroconductivity of the electroconductive film.

Preparation of PEDOT-PSS

A PEDOT-PSS water dispersion was commercially obtained (Clevios PH 1000 available from Heraeus Holding GmbH). In this PEDOT-PSS water dispersion, the solid content is 1.0 to 1.3% by weight (based on the whole), and the weight ratio of PEDOT to PSS contained is expressed as 1:2.5.

Preparation of Binder Resin

Butyl acrylate and DMAA (N,N-dimethylacrylamide) as a monomer containing an amide group were prepared. These were added to a mixed solvent of water and isopropanol (volume ratio of 50:50) so that the mole ratio between these monomers is 100:0, 95:5, 50:50 or 0:100 and the total monomer concentration is 20% by weight (based on the whole). To 100 parts by weight of the mixture thus obtained, 0.1 parts by weight of azobisisobutyronitrile were added and the mixture was allowed to undergo polymerization at 80° C. to obtain binder resins a to d. The molar proportions (m/(m+n)×100(%)) of the monomer unit containing an amide group to the whole monomer unit are 0, 5, 50 and 100% in polymers a to d, respectively, and binder resins b to d are polymers having an amide group as a side chain.

Preparation of Electroconductive Composition

The above-mentioned PEDOT-PSS water dispersion and a 20% by weight (water-isopropanol) solution of each of the binder resins a to d were mixed with isopropanol, ethylene glycol and pure water to obtain electroconductive compositions A to D having the following composition.

PEDOT-PSS water dispersion (Clevios PH 1000) 40 parts by weight

20% by weight solution of each of the binder resins (a to d) 10 parts by weight

Isopropanol 35 parts by weight

Ethylene glycol 5 parts by weight

Water 10 parts by weight

The electroconductive compositions B to D are Examples of the present invention and the electroconductive composition A is Comparative Example.

Preparation of Composite Material

P(VDF-TrFE-CFE) as a vinylidene fluoride-based resin material was cast so as to have a thickness of 10 μm on a film composed of PET (polyethylene terephthalate) with a thickness of 38 μm to prepare a vinylidene fluoride-based resin base material composed of two layers of the PET film and the P(VDF-TrFE-CFE) layer.

Then, each of the above-prepared electroconductive compositions A to D was coated on a surface of the vinylidene fluoride-based resin material layer side of this vinylidene fluoride-based resin base material so as to have a thickness of 27.4 μm with a number 12 bar coater, and heated for 5 minutes at about 80° C. under an air atmosphere. In this way, an electroconductive film was formed from each of the electroconductive compositions A to D.

From the above, a composite material composed of a vinylidene fluoride-based resin base material and an electroconductive film covering one side thereof was prepared.

Evaluation of Adhesive Strength

The adhesive strength of the electroconductive film obtained from each of the electroconductive compositions A to D to the vinylidene fluoride-based resin base material (more specifically, the P(VDF-TrFE-CFE) layer) was evaluated through a crosscut method in accordance with JIS K5600-5-6. Specifically, the interval of a clearance in the cutter guide was set to 2 mm, 25 squares in total were formed in a grid pattern on the electroconductive film of the composite material, a tape was stuck onto the upper surface thereof, and then, the tape was stripped off to count the number of squares in which the film is not stripped off from the vinylidene fluoride-based resin base material and is left behind. The results are shown in Table 1.

TABLE 1

| Electroconductive composition | m/(m + n) × 100 (%) | Number of squares in which the film is not stripped off and is left behind/Total number of squares |
|---|---|---|
| A | 0 | 3/25 |
| B | 5 | 21/25 |
| C | 50 | 25/25 |
| D | 100 | 25/25 |

From the results shown in Table 1, it has been confirmed that whereas the adhesive strength is extremely low in the electroconductive composition A of Comparative Example (one in which a polymer having no amide group as a side chain is used as a binder resin), high adhesive strength is exhibited in the electroconductive compositions B to D of Examples in the present invention. Moreover, it is understood that the molar proportion (m/(m+n)×100(%)) of the monomer unit containing an amide group to the whole monomer unit is preferably set to 5 to 100%, more preferably set to 50 to 100%.

Evaluation of Electroconductivity

The electroconductive films obtained from the electroconductive compositions B to D were measured for the surface resistivity using the surface resistance measuring meter SLT-YKH4101 available from SILTEC TRADING OFFICE JAPAN Inc., whereupon the surface resistivity was determined to be 300 Ω/square in each of them. From these results, it has been confirmed that high electroconductivity, as well as high adhesive strength, is exhibited in the electroconductive compositions B to D of Examples in the present invention.

Furthermore, according to the following procedure, an actuator was prepared utilizing an electroconductive film obtained from the electroconductive composition according to the present invention.

P(VDF-TrFE-CFE) as a vinylidene fluoride-based resin material was cast so as to have a thickness of 10 μm on a film composed of PET (polyethylene terephthalate) with a thickness of 38 μm to obtain a layered product composed of two layers of the PET film and the P(VDF-TrFE-CFE) layer, after which the P(VDF-TrFE-CFE) layer was stripped off from the PET film to separate the P(VDF-TrFE-CFE) layer, and the layer was cut into dimensions of 18 mm in length and 9 mm in width to prepare a vinylidene fluoride-based resin base material composed of the P(VDF-TrFE-CFE) layer (10 μm in thickness).

Then, the above-prepared electroconductive composition C was coated on one side of the vinylidene fluoride-based resin base material so as to have a thickness after drying of 0.2 μm by screen printing, and heated for 5 minutes at about 80° C. in an air atmosphere to be dried. In this way, an electroconductive film was formed on one side of the vinylidene fluoride-based resin base material from the electroconductive composition C.

Separately, a film composed of PET (polyethylene terephthalate) with a length of 20 mm, a width of 10 mm and a thickness of 100 μm was prepared in advance, and on one side thereof, the vinylidene fluoride-based resin base material on which the electroconductive composition C had been coated as described above was stuck via the electroconductive film (electroconductive composition C). For sticking, an adhesive was used.

Furthermore, the above-prepared electroconductive composition C was coated on the other side (the opposite side to the PET film) of the vinylidene fluoride-based resin base material so as to have a thickness after drying of 0.2 μm by screen printing, and heated for 5 minutes at about 80° C. in an air atmosphere to be dried. In this way, an electroconductive film was formed on the other side of the vinylidene fluoride-based resin base material from the electroconductive composition C.

From the above, an actuator 40 shown in FIG. 1(a) was prepared. In this actuator 40, the vinylidene fluoride-based resin base material corresponds to an electrostrictive material layer 1, the electroconductive films formed on both sides thereof correspond to electrodes 3a and 3b, and the PET film corresponds to a base material 30 to which the electrostrictive material layer 1 is joined via the electrode 3a. In this actuator 40, the electrostrictive material layer (vinylidene fluoride-based resin base material) 1 and the electrodes (electroconductive films) 3a and 3b covering both sides thereof constitute the composite material according to the present invention, and function as an electrostrictive element 10. Lead wires 5a and 5b were connected to the electrodes 3a and 3b, respectively.

Figure 1B:
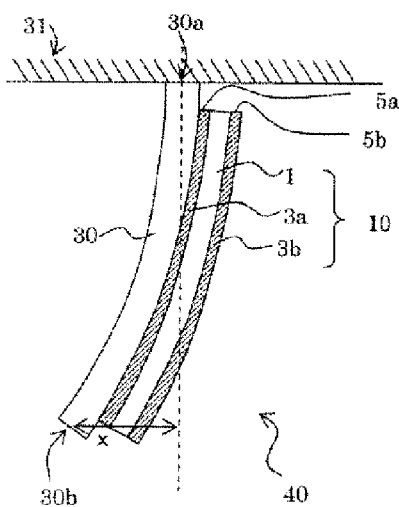

As shown in FIG. 1(a), in a state of allowing one end 30a of the base material (PET film) 30 in the actuator 40 prepared as above to be fixed to a plane surface 31, a direct current voltage of 500 V was applied between the electrodes 3a and 3b, whereupon, as shown in FIG. 1(b), the actuator was bent so that the electrostrictive material layer 1 faces outward and the base material 30 faces inward, and the other end (the tip not fixed) 30b of the base material 30 indicated a large amount of displacement of x=10 mm. The reason why bending deformation of the actuator 40 is generated in one direction in this way is because, when a voltage is applied between the electrodes 3a and 3b, the electrostrictive material layer (vinylidene fluoride-based resin base material) 1 sandwiched therebetween is contracted in the thickness direction (electric field direction) and expanded in the in-plane direction, and a dimensional difference is generated between the electrostrictive material layer 1 and the base material 30.

Accordingly, since the adhesive strength between the electrostrictive material layer (vinylidene fluoride-based resin base material) and the electrode (electroconductive film) is increased by utilizing the electroconductive composition and composite material according to the present invention, as a result thereof, there is provided an actuator with high reliability.

The electroconductive composition according to the present invention can be used as a film (or coating) material for electrode formation, for preventing the electrification, for shielding electromagnetic waves or the like, and moreover, as an electroconductive adhesive, an electroconductive paint (or ink) or the like. The composite material according to the present invention can be utilized for a piezoelectric or electrostrictive element and the like. However, the present invention is not limited to these applications, and for example, it can be very widely utilized for a lithium ion battery, a touch panel, a solar cell, a printed wiring board, an organic EL, an organic TFT, an organic semiconductor, an electrochromic device and the like.

DESCRIPTION OF REFERENCE SYMBOLS

1 Electrostrictive material layer
3a, 3b Electrodes
5a, 5b Electrodes
10 Electrostrictive element
30 Base material
30a One end
30b The other end
31 Wall surface
40 Actuator
x Displacement

The invention claimed is:

1. An electroconductive composition comprising:
polystyrene sulfonic acid;
poly(3,4-ethylenedioxythiophene);
water;
an organic solvent having an affinity to water; and
a polymer having an amide group as a side chain, wherein a nitrogen atom of the amide group is a tertiary nitrogen atom.

2. The electroconductive composition according to claim 1, wherein a weight ratio of the poly(3,4-ethylenedioxythiophene) to the polystyrene sulfonic acid in the electroconductive composition is 1:1.5 to 3.5.

3. The electroconductive composition according to claim 1, wherein the organic solvent is selected from the group consisting of at least one of an alcohol-based solvent, a ketone-based solvent, an amide-based solvent, an ether-based solvent, and a nitrile-based solvent.

4. The electroconductive composition according to claim 1, wherein the organic solvent is selected from the group consisting of at least one of a glycol and derivatives thereof.

5. The electroconductive composition according to claim 4, wherein the glycol is selected from the group consisting of ethylene glycol, propylene glycol, butylene glycol, diethylene glycol, dipropylene glycol, and triethylene glycol; and the derivatives are selected from glycol ethers.

6. The electroconductive composition according to claim 1, wherein the organic solvent has a solubility to the water of at least 20 mg/100 mL.

7. The electroconductive composition according to claim 1, wherein the electroconductive composition contains:
0.1 to 2% by weight of a total of the poly(3,4-ethylenedioxythiophene) and the polystyrene sulfonic acid;
10 to 70% by weight of the water;
10 to 70% by weight of the organic solvent; and
0.001 to 20% by weight of the polymer.

8. A composite material comprising:
a vinylidene fluoride-based resin base material; and
an electroconductive film covering at least a part of a surface of the vinylidene fluoride-based resin base material, wherein
the electroconductive film includes polystyrene sulfonic acid, poly(3,4-ethylenedioxythiophene) and a polymer having an amide group as a side chain, and a nitrogen atom of the amide group is a tertiary nitrogen atom.

9. The composite material according to claim 8, wherein a weight ratio of the poly(3,4-ethylenedioxythiophene) to the polystyrene sulfonic acid is 1:1.5 to 3.5.

10. The composite material according to claim 8, wherein the vinylidene fluoride-based resin base material is selected from the group consisting of a single polymer of vinylidene fluoride, an interpolymer of the vinylidene fluoride, and one or more monomers copolymerizable therewith.

11. An actuator comprising:
a base; and
a composite material according to claim 8 joined to the base.

12. A method of preparing an electroconductive composition, the method comprising:
copolymerizing at least a monomer containing an amide group and at least one of a (meth)acryl-based monomer and a vinyl-based monomer so as to obtain a polymer having an amide group as a side chain, and a nitrogen atom of the amide group is a tertiary nitrogen atom; and mixing the polymer having an amide group as a side chain with polystyrene sulfonic acid, poly(3,4-ethylenedioxythiophene), water and an organic solvent having an affinity to water to obtain the electroconductive composition.

13. The method of preparing an electroconductive composition according to claim 12, wherein a weight ratio of the poly(3,4-ethylenedioxythiophene) to the polystyrene sulfonic acid in the electroconductive composition is 1:1.5 to 3.5.

14. The method of preparing an electroconductive composition according to claim 12, wherein the organic solvent is selected from the group consisting of at least one of a glycol and derivatives thereof.

15. A method of preparing a composite material including a vinylidene fluoride-based resin base material and an electroconductive film, the method comprising:
   supplying at least a part of a surface of a vinylidene fluoride-based resin base material with an electroconductive composition including polystyrene sulfonic acid, poly(3,4-ethylenedioxythiophene), water, an organic solvent having an affinity to water and a polymer having an amide group as a side chain and a nitrogen atom of the amide group is a tertiary nitrogen atom; and
   removing the water and the organic solvent from the electroconductive composition to form an electroconductive film.

16. The method of preparing a composite material according to claim 15, wherein a weight ratio of the poly(3,4-ethylenedioxythiophene) to the polystyrene sulfonic acid is 1:1.5 to 3.5.

* * * * *